United States Patent [19]

Burkum et al.

[11] Patent Number: 4,540,935

[45] Date of Patent: * Sep. 10, 1985

[54] APPARATUS FOR IDENTIFYING DEFECTIVE ELECTRIC POWER DISTRIBUTION CAPACITORS

[75] Inventors: Merlin E. Burkum, Elmhurst; Timothy M. O'Regan, Chicago, both of Ill.

[73] Assignee: Commonwealth Edison Company, Chicago, Ill.

[*] Notice: The portion of the term of this patent subsequent to Jan. 10, 2001 has been disclaimed.

[21] Appl. No.: 567,783

[22] Filed: Jan. 3, 1984

Related U.S. Application Data

[63] Continuation-in-part of Ser. No. 301,949, Sep. 14, 1981, Pat. No. 4,425,541.

[51] Int. Cl.³ .................... G01R 31/08; G01R 31/02
[52] U.S. Cl. .................................................. 324/52
[58] Field of Search .................... 324/51, 52, 54, 251, 324/252, 117 H, 127

[56] References Cited

U.S. PATENT DOCUMENTS

| 1,823,492 | 9/1931 | Houck | 324/54 |
| 4,234,846 | 11/1980 | Maringer | 324/251 X |
| 4,425,541 | 1/1984 | Burkum | 324/51 |

OTHER PUBLICATIONS

Kahen: "Current Measuring System"—IBM Tech. Discl. Bulletin—Sep. 1969, pp. 633–634.

Primary Examiner—Stanley T. Krawczewicz
Assistant Examiner—Jose M. Solis
Attorney, Agent, or Firm—Emrich & Dithmar

[57] ABSTRACT

An apparatus for determining the operating condition of capacitors of the type used for power factor correction on electric distribution systems is assembled in two sections. A first power supply device supplies an alternating electric current to a de-energized capacitor without removing it from its installed position and a second power measurement device, utilizing either a split-core Hall-device or a special distributed winding, measures the magnitude of the electric current entering the capacitor being tested.

22 Claims, 3 Drawing Figures

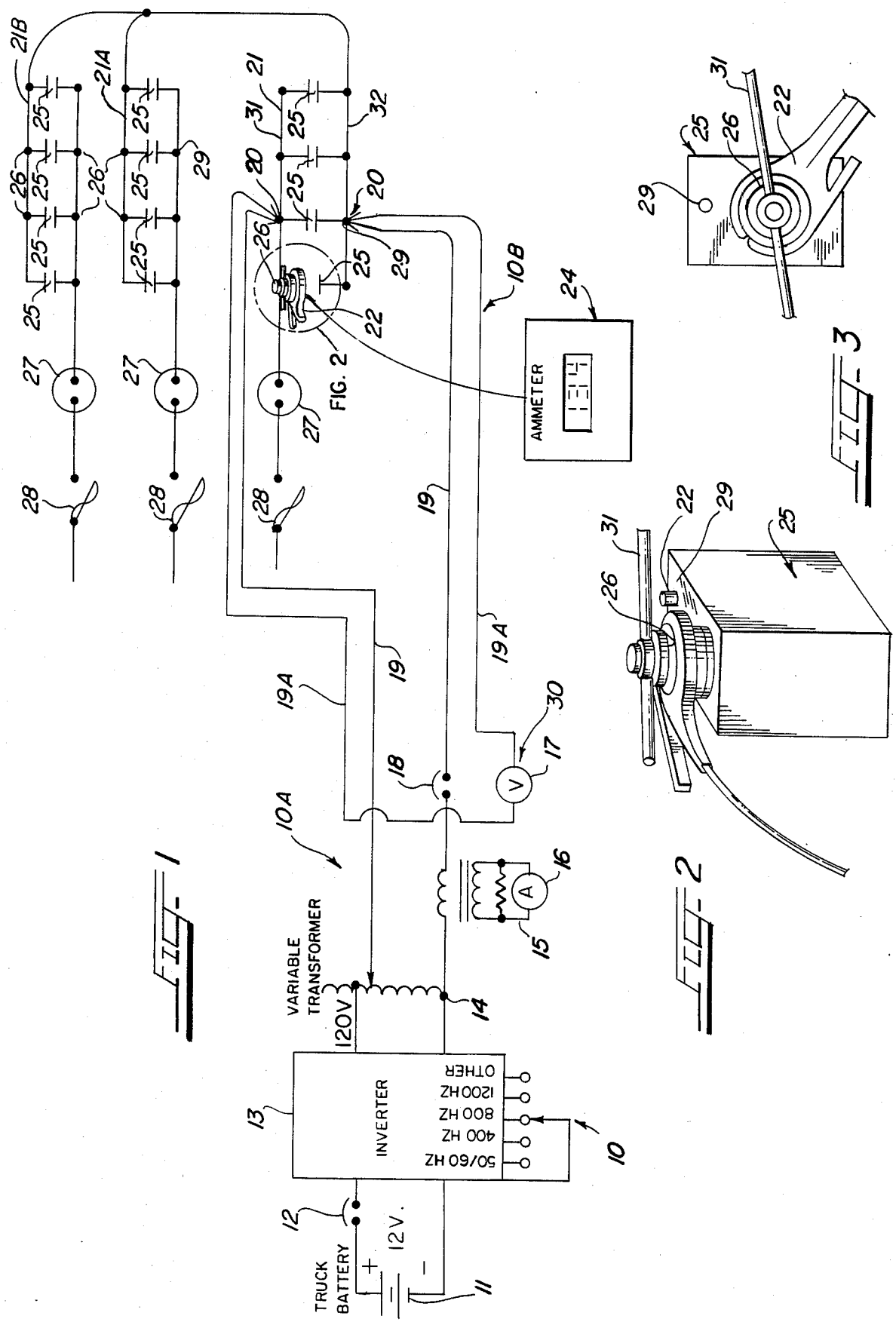

4,540,935

APPARATUS FOR IDENTIFYING DEFECTIVE ELECTRIC POWER DISTRIBUTION CAPACITORS

RELATED APPLICATION

This application is a continuation in-part of our co-pending application for APPARATUS FOR IDENTIFYING DEFECTIVE ELECTRIC POWER DISTRIBUTION CAPACITORS, filed Sept. 14, 1981, Ser. No. 301,949; now U.S. Pat. No. 4,425,541, issued Jan. 10, 1984.

BACKGROUND OF THE INVENTION

The present invention relates to an apparatus for the in-circuit detection of defective capacitors of the type used on electric power distribution systems.

The shunt connected high voltage distribution type capacitor units are used extensively by the electric utility industry and manufacturing industry in their electrical supply systems for correcting the power factor of the system and maintaining voltage levels. A common method of construction of these capacitors consists of two sheets of pure aluminum foil separated by layers of kraft paper or plastic film impregnated with chromated aromatic hydrocarbon compounds. A capacitor unit is made up of several of these individual small sized capacitor packs or rolls which are connected in a parallel-series arrangement in order to obtain the desired capacitance value and withstand the high voltages in the range of 2000 volts to 20,000 volts. Before the capacitor unit is enclosed in a sealed metal can, having two insulated bushing-type terminals extending from the top, the metal can is filled with an insulating flammable liquid. Before 1977, most capacitor units contained PCB-type insulating fluids. However, such materials have been condemned because of toxicity and environmental problems. These capacitor units are connected to the distribution line at various locations close to the load centers and are installed singly or in parallel banks of two, three or four per line phase. Generally, only one fuse is employed to clear a bank of 2, 3 or 4 capacitor units, should an electrical short to ground occur on one of the capacitor unit cans.

It is important that as many of the capacitor units as possible in an electric distribution system be in a serviceable condition so that during periods of high electrical load the system voltage is held within an acceptable range. However, because of periodic failures and bank fusing, at any given time there may be a large number of capacitor units disconnected from the system and awaiting service. In order to compensate for these failed capacitor units, either a surplus of capacitor units over and above the minimum necessary is required, or the generators must supply the additional reactive power at the expense of producing real power. In either case, the result is an unacceptable additional monetary expense.

Prior to the present invention, detection of failed capacitor units by electric utility linemen has been primarily that of a visual observation. A blown fuse is one signal to a lineman that a bank of capacitor units is out of service. One or more of the capacitor units may be defective, or possibly the fuse was blown for a reason other than a shorted capacitor. If the lineman cannot visually detect a sign of failure, such as a bulged metal can or a leaking seam or bushing, the operating practice has been to re-energize the bank of capacitors with a new fuse.

The above practice has very serious drawbacks and limitations. First, should the capacitor bank be re-energized when a capacitor unit actually has an electrical short, for which no visual indication is apparent, there is the increased possibility of a violent rupture and release of the dielectric fluid onto the immediate area. Containment of the liquid dielectric fluid within the capacitor can is very important because the capacitor units containing PCB-type insulating fluids must not be allowed to contaminate the immediate area.

Secondly, a capacitor unit may have a partial or incipient fault because one of the small series of connected packs, making up the total capacitor unit, has shorted or opened. The capacitor unit may withstand the applied distribution line voltage for a short time, perhaps hours or weeks, by a redistribution of the line voltage across the remaining operative series connected capacitor packs. However, arcing by the shorted capacitor pack can cause the dielectric fluid and insulation to decompose into hydrocarbon gases, bulging the capacitor can and creating a potentially explosive condition when the eventual electrical failure of the capacitor unit occurs.

There have been several suggested methods and apparatuses for determining the condition of a capacitor unit, however, these suggestions all require operations which are normally beyond the assigned duties, and technical capabilities of the average lineman. For example, the USA Standards for Shunt Power Capacitors 0551-1968 describes various field tests for these type capacitor units. One such test requires the application of a known voltage and frequency of undistorted wave shape to the capacitor unit. However, this test of capacitance measurement requires disconnecting each capacitor unit from the remainder of the bank and then individually measuring the current drawn by each unit. Such tests require a high degree of technical competence to interpret the resultant meter readings and the manpower cost associated with such tests are prohibitive. Moreover, the disconnecting and handling of the capacitor unit can cause damage to the capacitor unit which results in incipient faults.

Also, commercially available capacitance meters, which apply a low AC voltage to provide a direct capacitance reading of the capacitor are unreliable on paper film capacitors. The gases created by arcing in a defective unit insulates the defective pack and capacitance readings obtained may be in error. Use of this device requires also disconnecting each unit in the capacitor bank during testing, which results in large manpower costs and expensive time loss during testing.

Lastly, the methods of determining the condition of the capacitor by measuring the current through the capacitor by ordinary split-magnetic core type ammeters lack sensitivity and are insufficiently shielded from the ambient electric and magnetic fields of the adjacent electric distribution lines to provide the necessary accurate readings to determine the condition of a capacitor unit. Accordingly, the measurement of the charging current to a specified single capacitor connected in parallel with similar capacitors utilizing an ordinary clamp-on type ammeter results in inaccuracies, due to the surrounding electrical and magnetic fields, which are unacceptable for determining the good/no good condition of that capacitor.

SUMMARY OF THE INVENTION

It is one object of the present invention to accurately determine the operating condition of a multi-pack, high-voltage capacitor unit of the type used in electric power distribution systems.

It is another object of the present invention to accurately detect incipient-type faults in multipack capacitor units of the type used in electric distribution systems.

It is still another object of the present invention to present a simplified operating method for the accurate determination and detection of the condition of a capacitor unit which may be readily understood by non-technical distribution system operating personnel.

It is a further object of the present invention to accurately determine the operating condition of a multipack, high-voltage capacitor unit in the presence of electric and magnetic fields normally present at a power capacitor bank installation.

It is still a further object of the present invention to allow the determination and detection of the condition of each multipack capacitor unit connected in parallel with two or more similar units without disconnecting the paralleled units from one another.

And, one more object of the present invention is to provide for the safe, self-powered operation of the fault detection assembly and procedure for the detection of the condition of a multipack capacitor unit at the installation site.

The present invention, although seemingly simple and straightforward in basic principles, is in reality a carefully coordinated assembled combination of electrical components which match the simplified testing requirements for correctly assessing the operating condition of electrical distribution power-type capacitors in the environment of large electrical and magnetic fields present at power capacitor bank installations used in electric power distribution systems.

The power capacitor tester assembly is comprised of a transmitter section and a measurement section. The transmitter section consists of a power source or storage battery, an input circuit breaker, a DC/AC inverter having voltage and frequency regulation, an auto-transformer adjustable from 0 to 140 volts, a current measurement circuit, an output circuit breaker, an output voltmeter, and electrical conductors to connect the electrical output of the inverter to the power capacitor unit to be tested. The receiver section may consist of a split-magnetic core probe or sensing means, which utilizes the Hall-effect or which utilizes a special distributed winding capable of an accurate reading even though the conductor is not centered on the split magnetic core probe, to produce a current which is measured by a current metering circuit.

The operation of the power capacitor tester assembly is described as follows. The storage battery, normally a 12 or 24 volt truck battery, is the energy source for a 12 or 24 volt DC to 120 or 240 volt AC inverter. The inverter has a normal 400 hertz output signal, but through a frequency doubling or tripling circuit, or separate oscillators, is adapted to produce higher frequencies such as 800 or 1200 hertz. However, the inverter is capable of an output signal from about 50 hertz to about 400 hertz, with 400 hertz being the optimum output signal. The 120 volt output from the inverter is fed into the variable transformer connected to the capacitor or bank of capacitors to be tested. The split-core, Hall-type sensing or special distributed winding sensing probe is preferably positioned about the phase bushing of the capacitor, and the electric current on the ammeter is read after the voltage from the variable transformer is set. However, it is within the scope of the present invention to position the Hall-type or special distributed winding probe around any lead exiting the capacitor provided the Hall-type or special distributed winding probe is positioned around the lead or bushing of the capacitor.

With the capacitor bank energized at the test voltage, the clamp-type sensing means or probe is positioned about any lead exiting the capacitor and the current taken by each individual capacitor is determined. The readings are compared with a chart of acceptable values. A reading lower than an acceptable current indicates there is an open circuit to one or more capacitor packs within the unit-can. A reading higher than an acceptable current indicates either a shorted capacitor pack within the unit or possibly a leakage path to ground. For either the high or low current readings, a probable incipient fault is indicated and the capacitor unit should be replaced.

Importantly, the 120–240 volt output from the variable transformer is the minimum required to assure that there is a sufficient test potential across each of the individual capacitor packs making up the capacitor unit. Higher potentials only serve to lessen the margin of safety to the operating personnel. However, when proper safety procedures are followed, it is possible to utilize a voltage output from the variable transformer of up to 480 volts.

BRIEF DESCRIPTION OF THE DRAWINGS

FIG. 1 is a schematic diagram illustrating the components of the power capacitor tester and the method of attachment to the power capacitor for testing in accordance with the present invention;

FIG. 2 is an enlarged perspective view of the encircled portion marked FIG. 2 showing the positioning of the split-core sensing means or probe about the phase bushing of the capacitor in accordance with the present invention; and FIG. 3 is a top plan view showing the positioning of the split-core sensing means or probe about the phase bushing of the capacitor in accordance with the present invention.

DETAILED DESCRIPTION

Referring now to FIG. 1, the power capacitor tester assembly or apparatus 10 is comprised of a transmitter section 10A and a measurement section 10B. The transmitter section 10A includes a power source or storage battery 11, an input circuit braker 12, a DC/AC power source or inverter 13, possessing precise voltage and frequency regulation, a transformer means 14 adjustable from 0 to 140 volts, a current measurement circuit 15, an output circuit breaker 18 and electrical conductors or connection means 19 to connect the electrical output of the inverter 13 to the power capacitor bank 21 to be tested. The voltage detection means 30 includes a pair of electrical conductors 19A and a voltmeter means 17. The voltage detection means 30 permits measuring an accurate alternating voltage at the terminals of the capacitor 26 from a point operatively positioned to the variable transformer controls 14 by the use of an output voltmeter means 17. The voltage detection means 19A and voltmeter means 17 are independent of the connection means 19 and the load magnitude on the connecting means does not effect the voltage detection means 19A or the voltmeter means 17. The receiver section 10B consists of a split-magnetic core probe element or sensing means 22 which utilizes either the Hall-effect or a special distributed winding capable of accurate readings when the conductor is positioned within the split-magnetic core probe element to produce and amplify a current which is measured by a current meter circuit device 24. One example of an acceptable Hall-type probe is the F. W. Bell Digital Current Meter Model #1776. An example of the special distributed winding probe is the AEMC Clamp-on Current Model #126.100, which has a current range of 100 milliamps to 35 amps with a ±2% accuracy. The maximum line operating voltage is 600 volts.

The operation of the power capacitor tester apparatus may be described as follows: The storage battery 11, normally a 12 volt battery, is the energy source for a the DC current which is directed to the 120 volt AC inverter 13. The inverter 13 has a normal 400 hertz output signal, but through a frequency doubling or tripling circuit, or separate oscillators, the inverter may produce higher frequencies, such as 800 or 1200 hertz. The 120 volt output from the inverter 13 is directed into a variable transformer 14, the output of which is connected to the capacitor 25 or bank of capacitors 21, 21A or 21B to be tested. The electrical conductors 19 and 19A are connected, one to the phase bushing terminal 26 and one to the ground or neutral terminal 29 of the capacitor 25. The split-core probe or device 22 is preferably positioned about the phase bushing 26 (FIGS. 2 and 3) on the individual capacitor 25 in the power capacitor bank 21 and the electric current on the current meter or ammeter 24 is read, after the voltage from the variable transformer 14 is set. It is preferable that the probe or device 22 and the current meter 24 have a sensing range from 0 to 15 amperes. Moreover, it is within the scope of the present invention to position the split-magnetic probe core element or device 22 around any lead exiting the capacitor.

For each capacitor unit rating, there is an acceptable range of amperage at the exact output voltage, normally 120 volts for which the capacitor is deemed acceptable.

Tables I and II provide examples of voltages and a calibrated acceptable range of amperes for a measurement circuit utilizing an AEMC probe Model 126.100 and 0-10 volt digital voltmeter manufactured by Nationwide Electronic Systems, Inc., with a 2600 ohm shunt. The acceptable range of amperes for a specific sized capacitor can is obtained by first observing the manufacture's listed nameplate capacitance, which is 100 percent capacitance value. Because the manufacture's nameplate capacitance possesses a tolerance of between 0 to +15 percent, when a known test voltage, between 120-480 volts, is applied at the capacitor terminal, the resultant current may be calculated, as is well known in the art. The present invention measures the actual current at the capacitor terminal with the known test voltage. This measured current is compared with the acceptable range of 95 to 118 percent of calculated current value. Observed values outside this range indicate defective capacitors.

TABLE I

CURRENT METER READINGS CAPACITOR NAMEPLATE VOLTAGE

| 7200 V. | | 2400 V. | |
|---|---|---|---|
| CAN SIZE (KVAR) | CURRENT RANGE AT 120 V. | CAN SIZE (KVAR) | CURRENT RANGE AT 50 V. |
| 50 | .655–.808 | 15 | .769–.927 |
| 100 | 1.46–1.76 | 25 | 1.32–1.58 |

TABLE I-continued

CURRENT METER READINGS CAPACITOR NAMEPLATE VOLTAGE

| 7200 V. | | 2400 V. | |
|---|---|---|---|
| CAN SIZE (KVAR) | CURRENT RANGE AT 120 V. | CAN SIZE (KVAR) | CURRENT RANGE AT 50 V. |
| 150 | 2.28–2.79 | 50 | 2.82–3.45 |
| 200 | 3.02–3.70 | 100 | 6.00–7.20 |
| | | 150 | 8.94–10.7 |
| | | 200 | 10.40–13.64 |

TABLE II

CURRENT METER READINGS CAPACITOR NAMEPLATE VOLTAGE 14400 V.

| CAN SIZE (KVAR) | CURRENT RANGE AT 120 V. |
|---|---|
| 50 | .174–.227 |
| 100 | .352–.438 |

One suggested test procedure for testing a bank of capacitors installed on an electric distribution pole utilizing an overhead line crew having a truck equipped with an aerial bucket may be described as follows:

The truck has an aerial bucket (not shown) which is used to lift a lineman into position next to the capacitor bank 21. The lineman carries with him the power leads 19 and voltage sensing leads 19A and a digital current meter 24. The lineman first disconnects the three phase capacitor bank 21, 21A and 21B from the high voltage line by opening the line switches 27 and capacitor fuse protectors 28 as provided. After waiting five minutes for the capacitor bank 21 to discharge through their internal resistors, a temporary ground is applied to ensure that no charge remains on the capacitor bank 21. Next, the ground is removed and the test circuit 10A is connected to the single phase capacitor bank 21 by means of leads 19 and 19A and the clamps 20 to common phase bus connection 31 and common neutral connection 32. As shown in FIG. 1, this connection is at 26 and 29. The inverter operator energizes the inverter 31 by means of the input breaker 12 and then adjusts the variable transformer 14 while he reads the test voltage on the voltmeter 17 while also observing the ammeter 16.

With the capacitor bank 21 energized at the test voltage, the lineman positions the probe or element 22 about the phase bushing 26 (FIGS. 2 and 3) and uses the current meter or ampmeter 24 to read the current taken by each individual capacitor 25. The readings are compared with a chart depicted in Table I of acceptable values. A lower than acceptable current indicates that there is an open circuit between the capacitor packs within the capacitor unit can 25. A higher than acceptable current indicates either a shorted capacitor pack within the capacitor unit 25 or possibly a leakage path to ground. For either the high or low current readings, a probable incipient fault is indicated and the capacitor 25 should be replaced.

Importantly, where there is insufficient current sensitivity because of testing small capacitors 25, the sensitivity can be increased by increasing the output frequency or voltage, as desired.

Generally, the 120–240 volt output from the variable transformer 14 is the minimum required to assure that there is a sufficient test potential across each of the individual capacitor packs making up the capacitor unit 25. Higher potentials only serve to lessen the margin of safety to the operating personnel. At the 120–240 volt safe level, an ordinary 60 hertz source does not furnish sufficient charging current to the capacitor to be readily measured accurately using a Hall-type probe. However, it has been found that the utilization of a special distributed winding probe 22 unexpectedly provided a more accurate and linear output in the range of amperage from 100 milliamps to 15 amps than the Hall-type probe. This improved accuracy and linear output permits the utilization of a smaller inverter at a lower frequency and which provides an ordinary 50/60 hertz source for large capacitors and up to about 800 hertz for smaller capacitors. Additionally, the present invention provides a complete system that is capable of testing a wide range of capacitors (2000–20,000 volts) at a given frequency of about 400 hertz. In the Hall-type probe, it was necessary to double the frequency and increase the power output to test such a range of capacitors. Thus, the use of a special distributed winding probe permits the use of a reduced power output by using a lower frequency, a result which was unattainable by using a Hall-type probe for most common capacitor sizes.

It will be seen that the present invention affords a novel apparatus for identifyig defective electric power distribution capacitors which is practical and efficient in operation and which may be readily applied by an average lineman. Further, the present invention is self-powered and may be transported easily to test sites. Moreover, the apparatus allows tests to be performed on the capacitor units 25 without disconnecting the units 25 from a common bus connection 31 and common neutral bus connection 32.

Thus, while we have illustrated and described the preferred embodiment of our invention, it is to be understood that this is capable of variation and modification, and we, therefore, do not wish to be limited to the precise details set forth, but desire to avail ourselves of such changes and alterations as fall within the purview of the following claims.

We claim:

1. An apparatus for detecting incipient faults in a power capacitor having at least a phase terminal, including in combination:
   an alternating current power source comprising a storage battery having an output of between 12 and 24 volts and an inverter having an input of between 12 and 24 volts D.C. and output of 120 volts at a frequency of about 60–800 hertz;
   a variable transformer for varying the output voltage of the said power source, said variable transformer having an output from 0 to 480 volts;
   connecting means for supplying alternating output voltage of said variable transformer to the power capacitor to be tested;
   voltage detection means for setting and measuring a predetermined alternating voltage supplied by said connecting means at the terminals of the power capacitor thereby to provide setting and reading a voltmeter means in conjunction with the controls of said variable transformer;
   an open and closed type, split-magnetic core probe means positioned about the phase terminal of the power capacitor for sensing the charging current from the output of said variable transformer of said connecting means which enters the capacitor being tested; and
   an ammeter for measuring the magnitude of the current output from said split-magnetic core probe to thereby detect a condition of a capacitor.

2. The apparatus in accordance with claim 1 wherein the output of said inverter is about 400 hertz.

3. The apparatus as recited in claim 2 wherein the output frequency of said inverter is doubled to about 800 hertz through the action of a frequency doubling circuit.

4. The apparatus in accordance with claim 1 wherein said split-magnetic core probe includes a distributed winding capable of an accurate reading in a current range of between 100 milliamps and 15 amps.

5. The apparatus as recited in claim 1 wherein said variable transformer has an input rating of 120 volts at 400 to 800 hertz and an output voltage variable from 0 to 140 volts.

6. The apparatus as recited in claim 1 wherein said variable transformer has an input rating of 120 volts at 400 to 800 hertz at an output voltage variable from 0 to 240 volts.

7. The apparatus as recited in claim 1 wherein said split-core probe and said ammeter have a sensing range from 0 to 15 amperes.

8. The apparatus in accordance with claim 4 wherein the output of said inverter is about 400 hertz.

9. The apparatus as recited in claim 8 wherein the output frequency of said inverter is doubled to about 800 hertz through the action of a frequency doubling circuit.

10. The apparatus in accordance with claim 1 wherein said voltage detection means includes a pair of electrical conductors consisting of a first electrical conductor connected to the phase terminal of the power capacitor with the opposite end thereof connected to a first terminal on said voltmeter means and a second electrical conductor connected to the neutral or ground of the power capacitor with the opposite end thereof connected to a second terminal on said voltmeter means.

11. An apparatus for detecting incipient faults in an individual capacitor unit having a phase terminal within a capacitor bank mounted within a common phase bus and common neutral bus, including in combination:
   an alternating current power source comprising a storage battery having an output of between 12 and 24 volts and an inverter having an input of between 12 and 24 volts D.C. and output of 120 volts at a frequency of about 60–800 hertz;
   a variable transformer for varying the output voltage of the said power source, said variable transformer having an output from 0 to 480 volts;
   connecting means for supplying alternating output voltage of said variable transformer to the capacitor bank having the individual capacitor units therein to be tested;
   voltage detection means for setting and measuring a predetermined alternating voltage supplied by said connecting means at the common phase and neutral buses of the capacitor bank thereby permitting setting and reading a voltmeter means in conjunction with the controls of said variable transformer;
   an open and closed type, split-magnetic core probe positioned about the phase terminal of the individual capacitor unit for sensing the charging current to the individual capacitor unit operatively connected to the capacitor bank from said variable transformer to the individual capacitor unit operatively connected to the capacitor bank; and an ammeter for measuring the magnitude of the current output from said split-magnetic core probe to thereby detect the condition of the capacitor unit.

12. The apparatus in accordance with claim 11 wherein the output of said inverter is about 400 hertz.

13. The apparatus as recited in claim 12 wherein the output frequency of said inverter is doubled to about 800 hertz through the action of a frequency doubling circuit.

14. The apparatus in accordance with claim 11 wherein said split-magnetic core probe includes a distributed winding capable of accurate reading in a current range of between 100 milliamps to 15 amps.

15. The apparatus as recited in claim 11 wherein said variable transformer has an input rating of 120 volts at 400 to 800 hertz and an output voltage variable from 0 to 140 volts.

16. The apparatus as recited in claim 11 wherein said variable transformer has an input rating of 120 volts at 400 to 800 hertz at an output voltage variable from 0 to 240 volts.

17. The apparatus as recited in claim 11 wherein said split-core probe and said ammeter have a sensing range from 0 to 15 amperes.

18. The apparatus in accordance with claim 14 wherein the output of said inverter is about 400 hertz.

19. The apparatus as recited in claim 18 wherein the output frequency of said inverter is doubled to about 800 hertz through the action of a frequency doubling circuit.

20. The apparatus in accordance with claim 11 wherein said voltage detection means includes a pair of electrical conductors, consisting of a first electrical conductor connected to a common phase connection of the capacitor bank with the opposite end thereof connected to a first terminal on said voltmeter means and a second electrical conductor connected to a common neutral or ground of the capacitor bank with the opposite end thereof connected to a second terminal on said voltmeter means.

21. A method for testing an individual power capacitor unit, which is part of a capacitor bank having at least a phase terminal, for detecting incipient or fully developed faults therein, without disconnecting the capacitor unit from the capacitor bank, comprising the steps of:

a. applying an alternating voltage variable from 0 to 480 volts at a frequency range of 60–800 hertz of a predetermined magnitude to the power capacitor bank, wherein the magnitude of the predetermined voltage is measured at the terminals of the capacitor bank;

b. measuring the value of the portion of total charging current entering the capacitor bank which enters each of the individual capacitor units with an associated ammeter without disconnecting the individual capacitor from the capacitor bank by means of a split magnetic core probe having a distributed winding around the case and having an accuracy of about 3 percent of the determined value; and c. comparing the measured values of the charging currents through the individual capacitor unit with the known allowable values for the individual capacitor reactive power rating for the applied predetermined voltage, the thereby detect incipient faults in the capacitor unit when the measured charging current is outside the range of the known allowable value.

22. The method of claim 21 wherein the alternating voltage applied to the capacitor bank is at a frequency of about 400 hertz.

* * * * *

UNITED STATES PATENT AND TRADEMARK OFFICE
CERTIFICATE OF CORRECTION

PATENT NO. : 4,540,935
DATED : September 10, 1985
INVENTOR(S) : Merlin E. Burkum and Timothy M. O'Regan It is certified that error appears in the above-identified patent and that said Letters Patent is hereby corrected as shown below:

Column 5, line 14, after "for a", delete "the";

Column 5, line 47, delete "manufacture's", insert --manufacturer's--;

Column 5, lines 48-49, delete "manufacture's", insert --manufacturer's--;

Column 6, line 46, delete "31", insert --13--;

Column 7, line 29, delete "identifyig", insert --identifying--;

Column 10, line 31, delete "the", insert --to--.

Signed and Sealed this

Twenty-sixth Day of November 1985

[SEAL]

Attest:

DONALD J. QUIGG

Attesting Officer

Commissioner of Patents and Trademarks